United States Patent [19]

Van Gaal et al.

[11] Patent Number: 5,450,272

[45] Date of Patent: Sep. 12, 1995

[54] TELECOMMUNICATIONS EQUIPMENT

[75] Inventors: Adrianus P. Van Gaal, Kanata; Joseph J. Lommen, Nepean; Brian T. Osborne, Kanata; Michael J. Coleman, Woodlawn; Remo Contardo, Ottawa; Peter J. Kielstra, Kanata, all of Canada

[73] Assignee: Northern Telecom Limited, Montreal, Canada

[21] Appl. No.: 161,014

[22] Filed: Dec. 2, 1993

[51] Int. Cl.6 ............................................. H05K 7/20
[52] U.S. Cl. .................................... 361/690; 361/728; 361/785; 361/803; 361/825; 361/831
[58] Field of Search .................... 361/689–690, 361/694–695, 725, 727, 730–733, 778, 779, 785, 789, 796, 803, 801, 825, 829, 831; 379/325–330, 332

[56] References Cited

U.S. PATENT DOCUMENTS

| | | | |
|---|---|---|---|
| 3,198,991 | 8/1965 | Barnett | 361/796 |
| 3,755,630 | 8/1973 | Boyer | 361/802 |
| 4,179,724 | 12/1979 | Bonhomme | 361/802 |
| 4,288,838 | 9/1981 | Veste et al. | 361/690 |

FOREIGN PATENT DOCUMENTS

| | | | |
|---|---|---|---|
| 4207531 | 9/1992 | Germany | 361/674 |
| 0250796 | 12/1985 | Japan | 361/725 |

Primary Examiner—Gregory D. Thompson
Attorney, Agent, or Firm—R. J. Austin

[57] ABSTRACT

A telecommunications shelf module is provided having electronic circuit packs and conductors extending from the circuit packs to an interface station for connection to conductors exterior of the pack, the module detachably mountable in a frame. The module preferably has a cooling arrangement included in its structure.

14 Claims, 6 Drawing Sheets

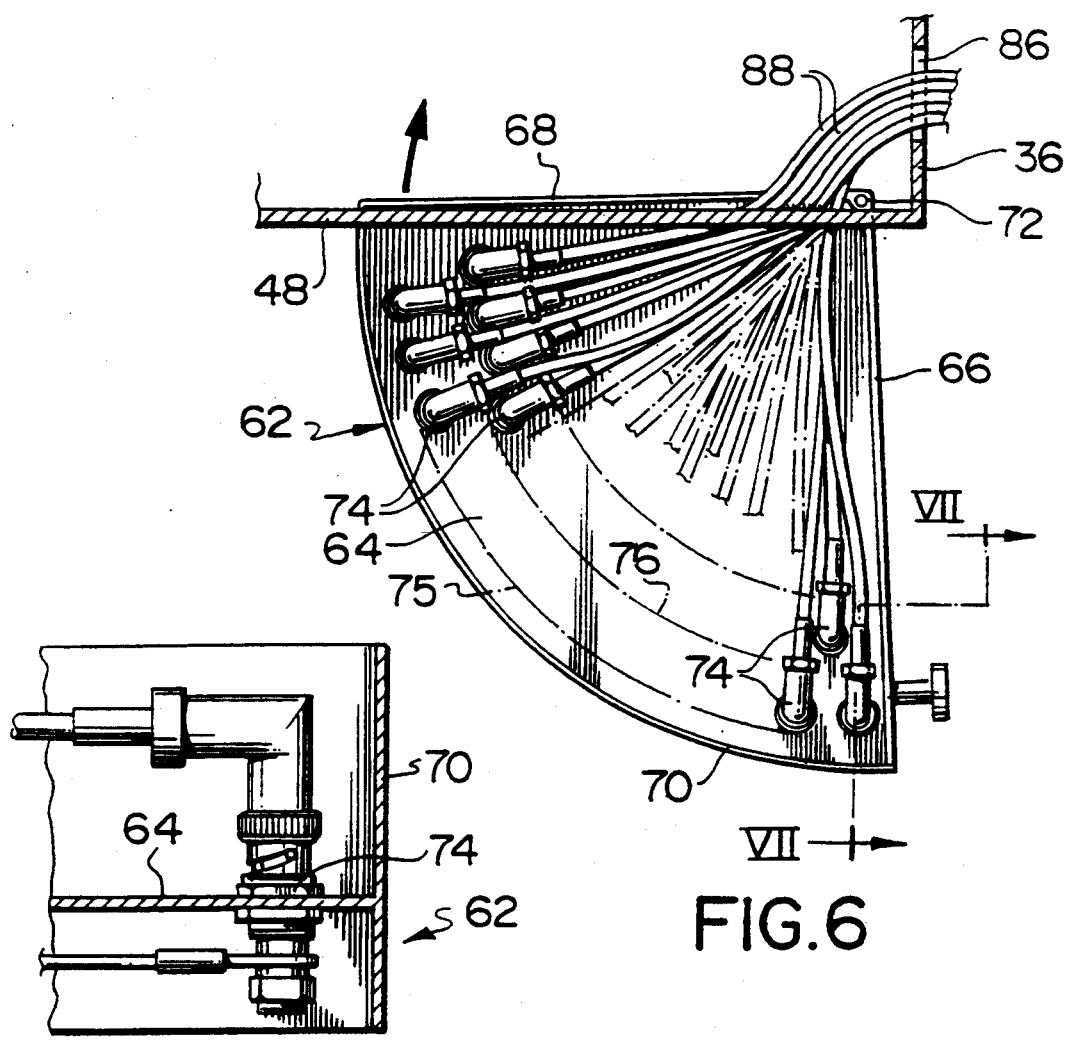
FIG.6
FIG.7
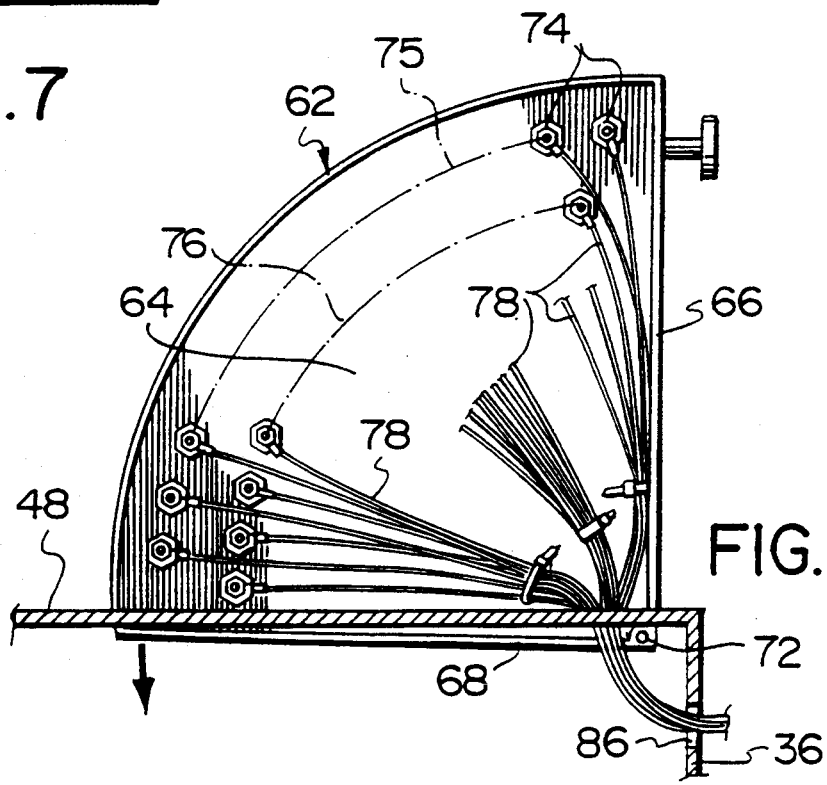
FIG.8

TELECOMMUNICATIONS EQUIPMENT

BACKGROUND OF THE INVENTION

1. Field of the Invention

This invention relates to telecommunications equipment.

2. Prior Art

In the telecommunications industry, telecommunications equipment is mounted in frames and is connected by signal conductors to other equipment mounted in other frames. Conventionally, components are mounted into shelves of such frames on site and circuit packs, when used, are fitted into the shelves. At the rear of the shelves, the circuit packs normally are connected to back planes and have connectors at their fronts from which the telecommunications conductors extend to other equipment items. The conductors necessarily extend across the fronts of the circuit packs and of the frames and the responsibility for their installation and of connecting them to the circuit packs is that of the installer. Installation of the conductors and their connection to the circuit packs is time consuming and tedious and, in view of this, together with the possibility of human error, interconnection mistakes are likely to occur. Such mistakes result in problem solving requirements which again is time consuming and tedious.

SUMMARY OF THE INVENTION

The present invention seeks to minimize or overcome the above problem.

According to one aspect of the present invention a telecommunications equipment shelf module comprises a shelf provided with a plurality of receiving stations for electronic circuit packs, a plurality of electronic circuit packs received within the plurality of receiving stations, telecommunications conductors extending between and interconnecting the circuit packs with connectors mounted in a connector interface station of the module for connection to further telecommunications conductors extending exteriorly of the module, and means for detachably mounting the module in a frame.

The shelf module according to the invention may be factory made as a unit and thus, quality control of the product is ensured. Because the signal conductors are provided in the module extending between the circuit packs and connectors in the connector interface station, then installation problems associated with the installer connecting the conductors directly to the circuit packs is avoided. In view of this, all that is required of the installer is to connect the further signal conductors from exterior equipment directly into the connectors at the connector interface station of the shelf module. As a result, quality control is maintained at a high standard while minimizing the mistakes which may be made during installation of equipment by an installer. In addition, the amount of time required on site in assembling telecommunications equipment is minimized with the use of the modular construction.

With the above structure according to the invention, cooling means are preferably provided for the circuit packs and with circuit packs disposed side-by-side horizontally in one or two vertically displaced rows, this leads to ease of circulation of a cooling fluid because of the vertical flow channels, which are thus provided. It is also preferred to provide a connector holder at the connector interface station, the connector holder housing the connectors and being movable between a connector housed position within a housing of the module and a connector access position with the connector holder moved forwardly of the housing. With this preferred arrangement, the telecommunications conductors extending from the circuit packs are advantageously positioned so as to extend rearwardly into the housing from the fronts of the packs and to the connectors contained within the connector holder. In this way, with the pre-built shelf module, the conductors are easily directed from the fronts of the circuit packs to the connector interface station for connection to other conductors extending to other telecommunications equipment. Thus, in the finished assembly of the shelf module into a frame, conductors are eliminated or virtually eliminated at the fronts of the circuit packs and of the frame. Further, in a preferred arrangement, the connector holder is pivotally connected at a front region of the housing of the module for pivotal movement between the connector housed and connector access positions. In this case, the conductors extending rearwardly into the housing may be required to extend outwardly from a side of the housing in one location and then inwardly into the side of the housing in another location so as to lie close to the pivotal axis of the connector holder as they extend to the connectors. With this arrangement, pivotal movement of the connector holder between its two positions requires an insignificant change in length of the conductors extending into the compartment, because the distance between the incoming conductors as they lie close to the pivotal axis and the connectors remains virtually the same. Thus, movement of the conductors lengthwise relative to the housing which could result in abrasion of conductors is avoided.

According to a further aspect of the present invention, telecommunications equipment is provided comprising a frame having a plurality of bays for detachably receiving telecommunications equipment shelf modules, at least one of the modules comprising a shelf provided with a plurality of receiving stations for electronic circuit packs, a plurality of electronic circuit packs received within the plurality of receiving stations, telecommunications conductors extending between and interconnecting the electronic circuit packs with connectors mounted in a connector interface station of the housing for connection to further telecommunications conductors extending exteriorly of the module, and the frame and the at least one shelf module having cooperable means for detachably holding the module in one of the bays.

The invention also includes telecommunications equipment comprising a housing, a connector holder for holding connectors for telecommunications conductors, the connector holder pivotally mounted to the housing and pivotally movable between a connector housed position with the connector holder within the housing and a connector access position with the connector holder pivoted forwardly of the housing, the connector holder having spaced apart connector mounting positions in at least one arc around the pivotal axis of the connector holder.

With the telecommunications equipment according to the invention in the last preceding paragraph, the connector holder structure and location of the connector mounting positions is such as to allow for compactness and density of connectors. It has been found that with connectors disposed in an arc as in constructions according to the invention and around the pivotal axis of the connector holder, then this allows for ease of connection of the conductors to the connectors. In addition, the conductors may be caused to extend radially inwards from the connectors towards the pivotal axis so as to emerge from the connector holder in a position adjacent to the pivotal axis, and virtually no change in length of conductors is required during pivotal movement of the connector holder. In essence therefore, the connector mounting positions are disposed in an array around the arc extending around the pivotal axis and result in the conductor positioning being neat and closely controlled.

In a preferred arrangement, the connector mounting positions are disposed in a plurality of arcs extending around the pivotal axis, one arc inside another and with the mounting positions staggered around the pivotal axis from each arc to an adjacent arc. With this preferred arrangement, the compactness of the spacing of the connector mounting positions is increased. The staggering of positions is provided to enable conductors to extend towards the pivotal axis across the connector holder from mounting positions in an outer arc by passage between mounting positions in an inner arc or arcs.

BRIEF DESCRIPTION OF THE DRAWINGS

One embodiment of the invention will now be described, by way of example, with reference to the accompanying drawings, in which:

FIG. 6 is a top plan view of the connector holder and showing the holder in a connector access position;

FIG. 7 is a cross-sectional view through part of the connector holder and taken along line VII—VII in FIG. 6 and to a larger scale; and FIG. 8 is a view similar to FIG. 5 but with the connector holder in the connector access position.

DETAILED DESCRIPTION OF THE EMBODIMENT

Figure 1:
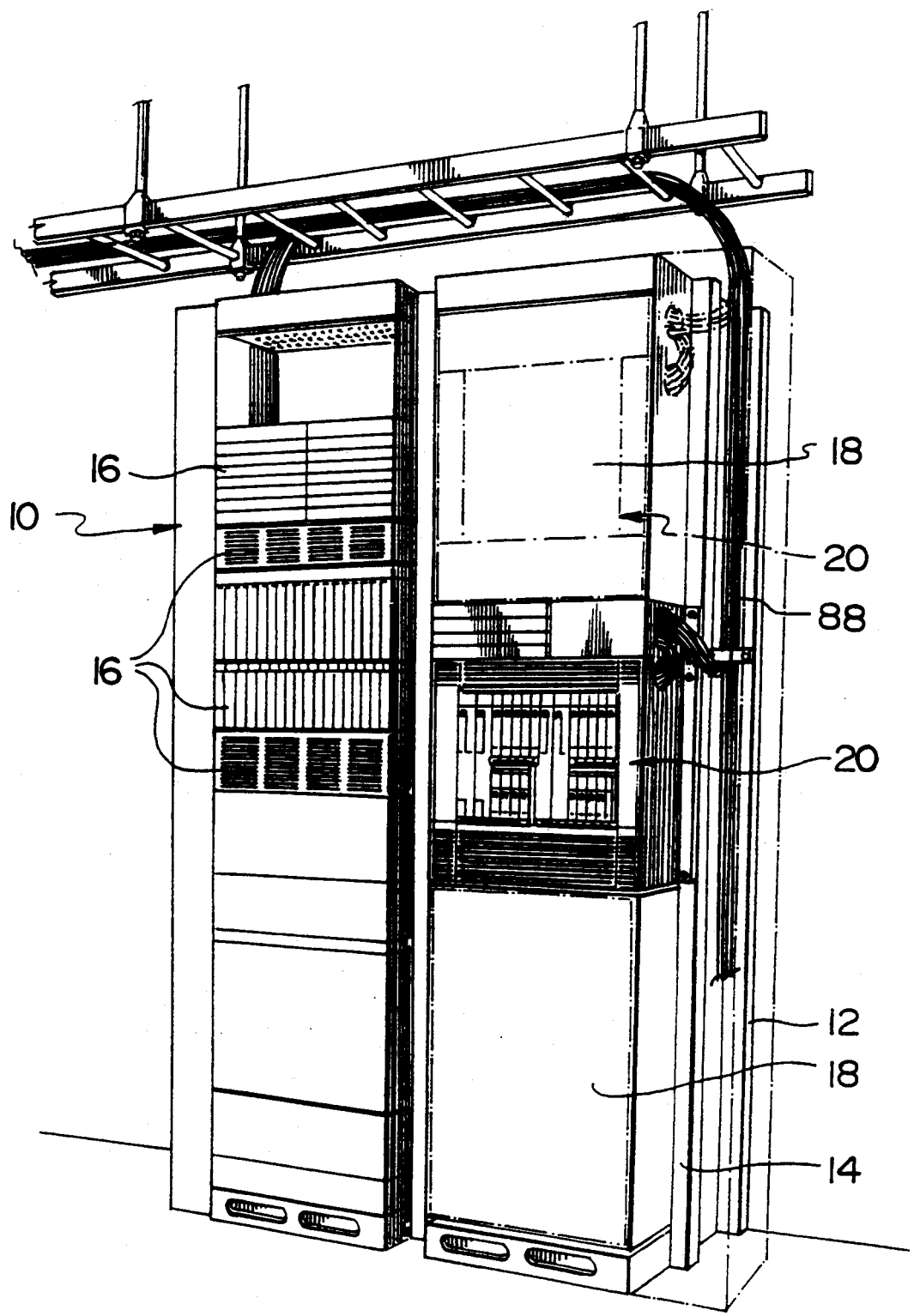
FIG. 1 is a front isometric view of telecommunications equipment showing shelf modules in position.
Figure 2:
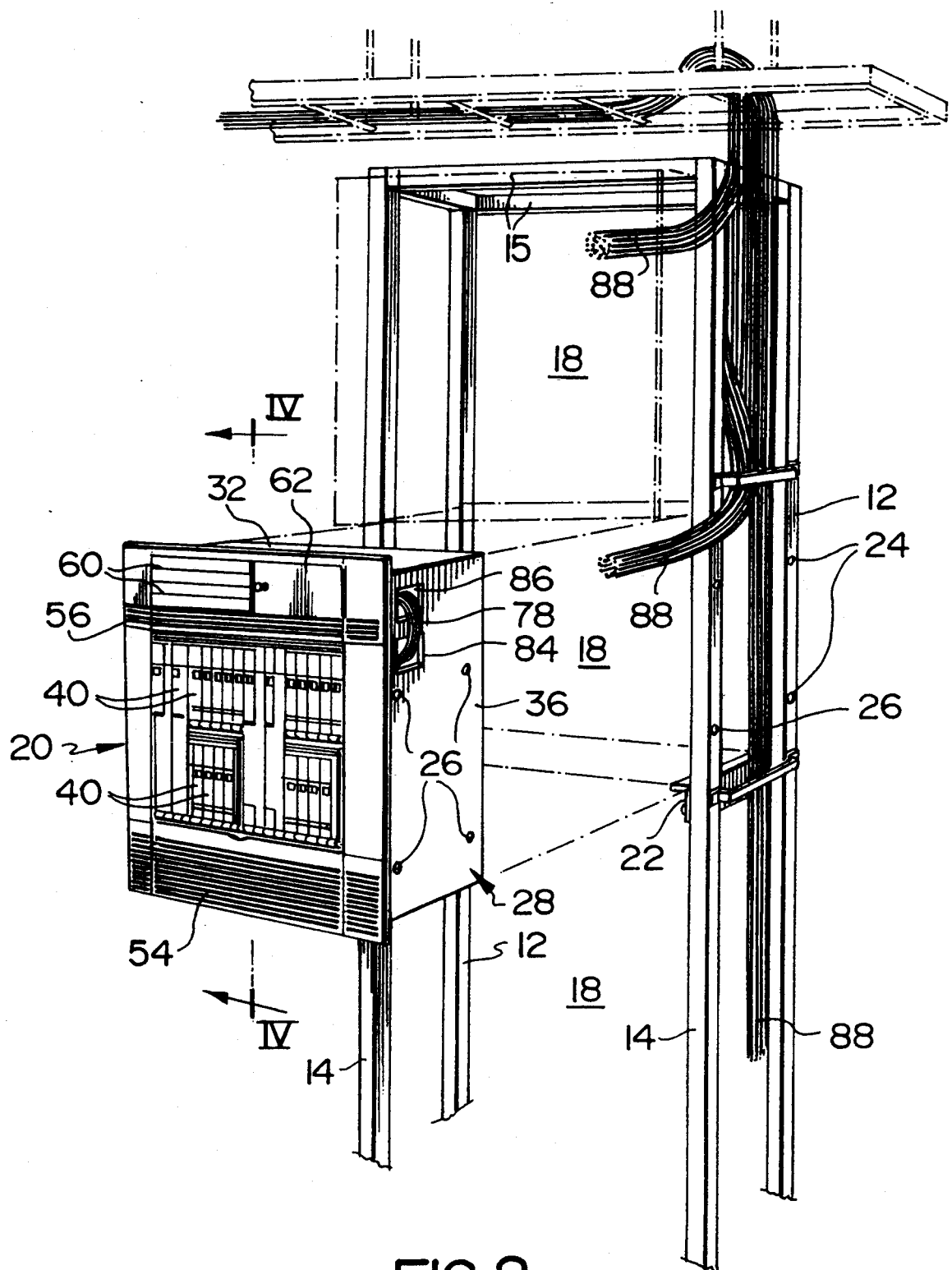
FIG. 2 is a front exploded isometric view of part of the equipment of FIG. 1 to show a shelf module in more detail and on a larger scale.

As shown in FIGS. 1 and 2, telecommunications equipment 10 comprises a stationary frame comprising vertical rear frame members 12 and front frame members 14 which are horizontally spaced apart by horizontal frame members, such as shown at 15 in FIG. 2, to provide a rigid structure.

The equipment 10 has different items 16 of equipment in a left-hand bank as shown in FIG. 1. However, in the right-hand bank, and as shown particularly in FIG. 2, the frame is provided with a vertical stack of bays 18, namely three, for containing shelf modules 20 of equipment. Each shelf module 20 (one only being shown for description purposes) is slidably received within its appropriate bay 18 and for this purpose means is provided with means for detachably receiving and holding each of the modules in position. The receiving and holding means comprises, for each bay, horizontally spaced-apart guide and support rails 22 extending between frame members 12 and 14, bolt holes 24 in the frame members for reception of bolts (not shown) into aligned holes 26 in the module when disposed correctly within its appropriate bay.

Figure 3:
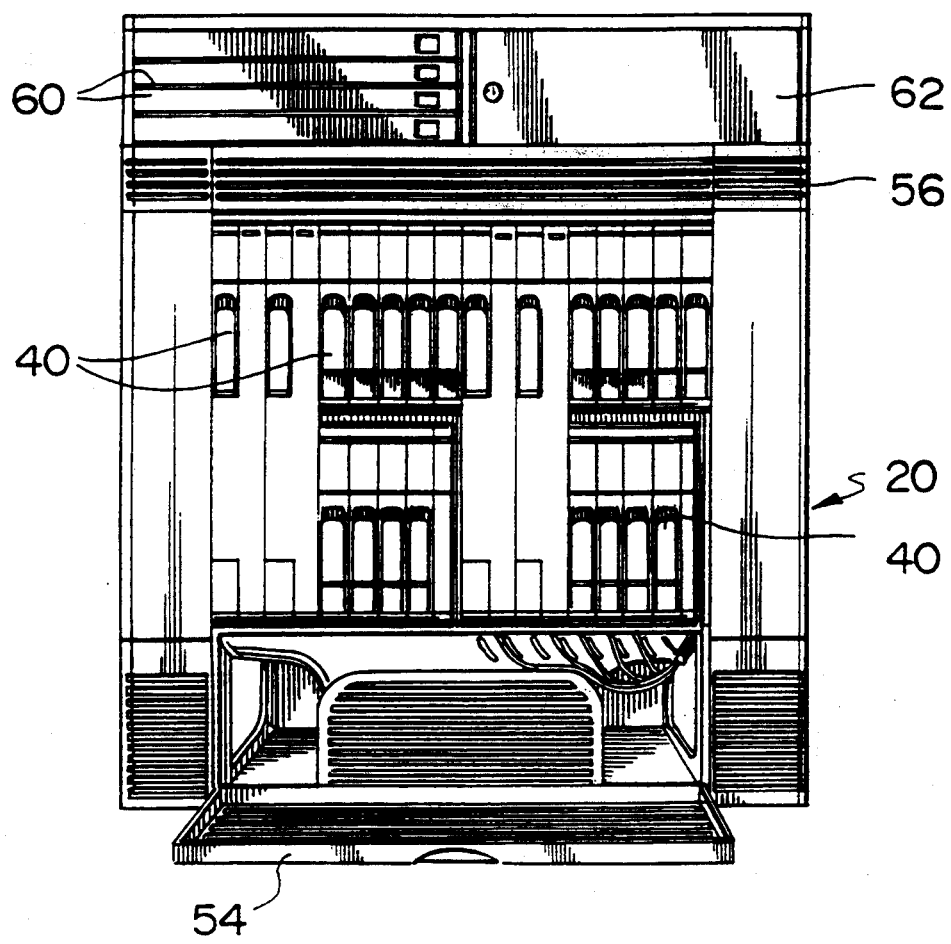
FIG. 3 is a front elevational view of a shelf module and to a larger scale than FIG. 2.
Figure 4:
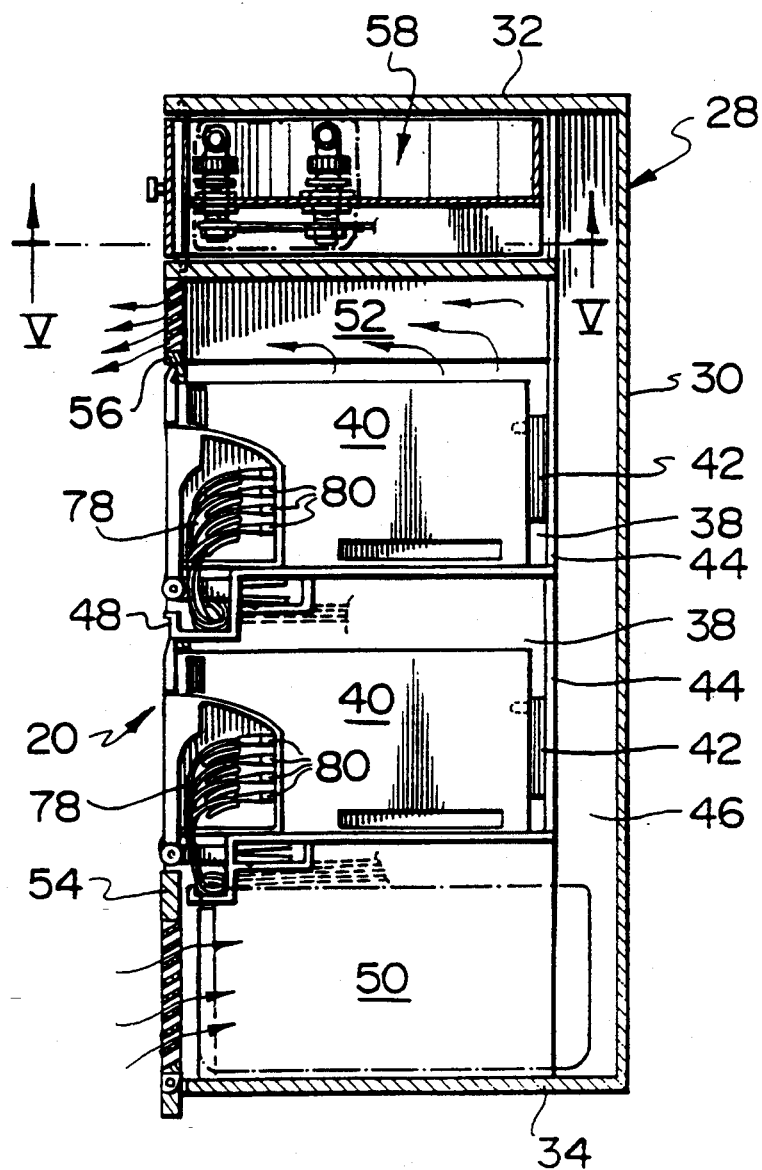
FIG. 4 is a cross-sectional view through a shelf module taken along line IV—IV in FIG. 2 and to a much larger scale.

Each module 20 is of rectangular box-shape which, as shown by FIGS. 2 and 4, is provided by an outside housing 28 having a rear wall 30, top and bottom walls 32 and 34 and side walls 36. Within the box are provided a plurality of receiving stations 38 for electronic circuit packs 40. The circuit packs 40 are arranged side-by-side horizontally in two rows, one above another, as shown particularly in FIGS. 3 and 4, with connectors 42 at the rear ends of the packs connected into a back plane or planes 44 which extend vertically at the rear of the receiving stations 38 in a spaced position from the rear wall 30 to provide a vertical space 46 forwardly of the rear wall. The circuit packs 40 may be slidably inserted and withdrawn from the front of the module through a central opening provided in a front wall 48 of the housing.

Cooling flow passage means is provided in each module. As shown in FIG. 4 the cooling flow passage means comprises an inlet chamber 50 disposed below the circuit packs 40 and an outlet passage 52 disposed above the circuit packs. These two passages are interconnected by flow passages defined between adjacent circuit packs 40 in the receiving stations, the circuit packs having side walls which are slightly spaced-apart for this purpose. The inlet and outlet passages 50 and 52 are also interconnected by means of the chamber 46 defined between the back plane 44 and the rear wall 30. Thus, in use, there is circulation of cooling air by convection through the chamber 50 and upwardly into the chamber 52. The inlet passage 50 receives its air through a louvered door 54 (see FIGS. 2, 3 and 4) which is pivotally hinged about a lower edge to enable it to be lowered into the position in FIG. 3 for any maintenance purposes. The outlet passage 52 exhausts air through a louvered panel 56 forming part of the front wall 48.

The shelf module is provided with a connector interface station 58 which is disposed above the outlet passage 52. At the left-hand side of the station 58 as viewed in FIGS. 2 and 3, there are provided tiered pivotal trays 60 which are pivotally mounted in a manner not shown, for movement out of a stowed position, as shown in FIGS. 2 and 3 to a forward position for access purposes. These trays are optical fiber storage and connector trays. In the event that one or more of the circuit packs 40 is to be connected by optical fibers to outside equipment, i.e. away from the frame 10, then optical fibers from this circuit pack or packs will extend to the trays 60 for storage purposes and for purposes of connecting these fibers into optical connectors, other ends of which are to be connected by an installer of the equipment to the outside equipment.

Also provided in the connector interface station 58 is a connector holder 62 (FIGS. 2, 3 and 4) which, as will now be described, is for receiving electrical conductor wires from the packs 40 in the event that the packs are to be serviced electrically.

Figure 5:
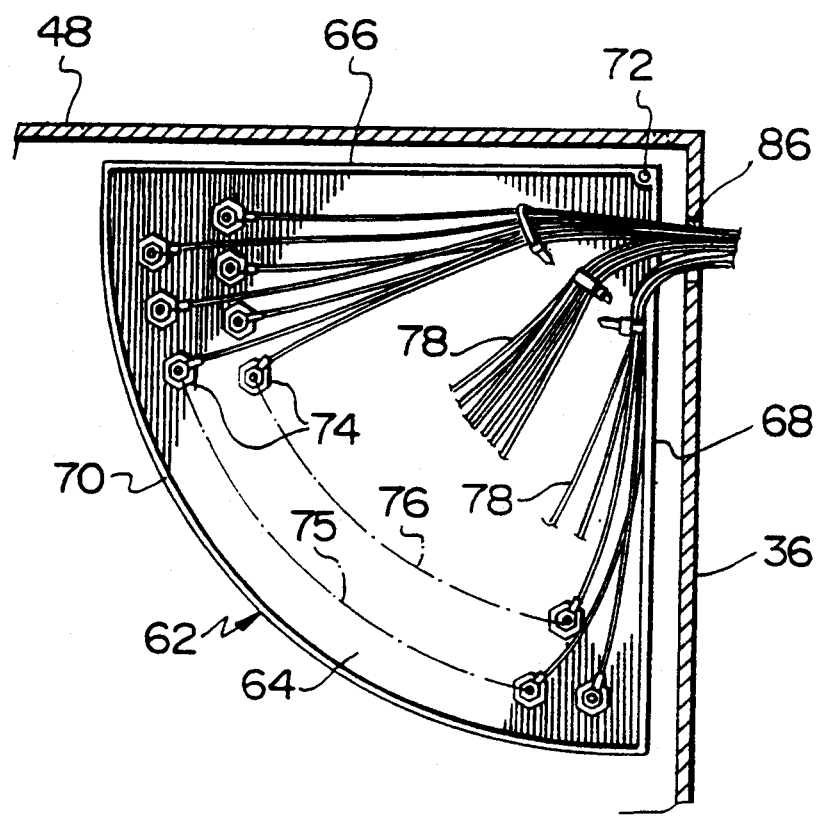
FIG. 5 is a cross-sectional view taken along line V—V in FIG. 4 to show the underside of a connector holder for connectors, to a larger scale than FIG. 4 and with the holder connector housed position.

The connector holder 62 is shown in detail in FIGS. 5, 6, 7 and 8. In underside plan view as shown in FIGS. 5 and 8 and plan view in FIG. 6, the connector holder 62 is shaped as a quadrant of a circle, this shape being fundamentally provided by a base 64. The base has radial edge flanges 66 and 68 and a part circular flange 70 at the arcuate edge of the base. Holder 62 is mounted in the housing of the module so as to be movable outwardly from a stowed position within the housing to a position extending outwardly from the front of the housing for access to the connectors for installation and maintenance purposes. For this purpose, the holder is pivotally mounted at the front of the housing about a pivotal position 72 which coincides with the center of the circle of which the base 64 forms a quadrant. FIGS. 1, 4 and 5 show the connector holder in the stowed position while FIGS. 6 and 8 show it in the outer connector access position.

Telecommunications connectors 74 are mounted to the base 64 in such a manner as to provide compactness and maximization of density of the connectors. This object is achieved by disposing the connector mounting positions in spaced-apart locations around at least one arc which is centered upon the pivotal axis of the connector holder. Preferably, and as shown in the embodiment, there is more than one arc of connector mounting positions. In the embodiment, two connector mounting position arcs 75 and 76 are shown and the connectors are mounted around these two arcs with the connector mounting positions staggered from one arc to the other along the arcs. Electrical conductors 78 extend from connectors 80 at the fronts of the circuit packs 40 and extend slightly forwardly of the packs before extending downwardly and then rearwardly for a distance behind the circuit packs before progressing upwardly of the module 20 through gaps and passages provided within the module. These conductors 78 then proceed through an aperture 84 towards the upper front of the housing wall 36, the conductors being arcuately bent on the outside of the housing side to re-enter the housing through an upper aperture 86. The aperture 86 directs the conductors, as shown in FIGS. 5 and 8, towards the underside of the base 64 of the connector holder and in such a position that as the conductors extend towards their respective connectors 74, they pass closely adjacent to the pivotal axis 72. The conductors therefore move basically radially from the pivotal axis 72 to their respective connectors. As may be seen, the conductors extending to the connectors in the outer arc 75 pass easily between the conductors on the inner arc 76 because of the staggered relationship of the connectors in the two rows. The relative positioning of the connectors on each arc and between connectors in the arc 76 on the base 64 allow for compactness of the connectors with a high density upon the base 64 while enabling for ease of distribution of the conductors to their respective connectors. As may be seen particularly from FIGS. 5 and 8, the conductors enter the aperture 86 in bunched form, and then diverge from one another to their respective connectors in an orderly fashion which assists in installation and removal of the conductors as and when necessary.

As may be seen from the above description, the shelf module is factory built whereby a standard of assembly may be achieved by the manufacturer. Included in this is the fact that the circuit packs are each individually connected by the manufacturer to the connectors in the connector holder 62 and sufficient care is made possible by the manufacturer to connect the appropriate terminals of the circuit packs to the appropriate connectors. Together with this is the fact that the signal conductors 78 are pre-built into the module before final installation into the frame of the equipment and this enables the conductors to be bypassed from the front of the module, i.e. rearwardly into the module itself and to the connectors in the connector holder, whereby the finished assembly provides a clean frontal appearance with little or no conductors being apparent an than location. Such an arrangement with conductors being obscured from the front of the equipment would not be possible if the assembly of the parts were to be made in situ in the frame as according no conventional practice and in which the conductors extend exteriorly from the circuit packs directly to other telecommunications equipment. In this embodiment, however, as specified the conductors are not apparent from the front of the module in the finished equipment. Thus the module is completely controlled in its manufacture and may be tested exhaustively before being sent to the installer for connection to other telecommunications equipment.

Upon being received by the installer, it is simply necessary for him to dispose each module 20 in its respective bay 18 and secure it in position by the means described above. Incoming telecommunications conductors are then brought from outside telecommunications equipment and connected either to optical connectors in the trays 60 or to the connectors 74 in connector holder 62. Where conductors are brought to the connector holder 62, these are in the form of insulated conductor wires 88 which extend downwardly at one side of the frame adjacent to the position to be occupied by the sides 36 of the modules 20 having the apertures 84 and 86. The positions of such conductors are shown in FIGS. 1 and 2. When a module 20 has been disposed into its correct location in its bay 18, it is simply necessary for the installer then to insert the corresponding conductors 88 through the aperture 86 in the side 36 of the module 20 and extend these conductors 88 across the top surface of the base 64 for instance as shown by FIG. 6. These conductors extend through the aperture 86 as a bunch of connectors and then diverge to their respective connectors in a manner similar to the positioning of the conductors 78 beneath the base 64. Thus, the conductors 88 also diverge from the aperture 86 as they proceed radially of the pivot position 72. The conductors 88 are easily connected to the connectors by disposing the connector holder 62 in its connector access position forwardly of the frame and as shown in FIG. 6. When the conductors 88 are correctly connected to the module 20, then the connector holder is pivoted rearwardly into its storage position and as shown by FIG. 5. As will be realized, movement between the storage and connector access positions (compare FIGS. 5 and 8) is accompanied mainly by a mere bending of the conductors 78 and 88 as they pass through the aperture 86 to their respective connectors. Because the conductors extend mainly radially of the pivot position 72 then the movement of the connector holder 62 requires no significant change in length of the conductors between these two positions whereby conductors are not required to move to and fro excessively through the aperture 86. It follows therefore that the module structure of the invention and as described in the embodiment is for ease of quality control during manufacture while minimizing any chances of human error during installation in the field. Further to this, a factory built module enables conductors to be hidden from the front of the module whereas this would be impossible if the telecommunications equipment were built on site from their individual pieces of equipment. In addition, the connector holder is itself of unique construction and occupies a minimal space while allowing for a high density of mounting positions for the connectors.

What is claimed is:

1. A telecommunications equipment shelf module comprising a shelf having a housing with a plurality of receiving stations for electronic circuit packs within the housing, a plurality of electronic circuit packs received within the plurality of receiving stations, a connector holder mounted at a connector interface station at a front region of the module, a plurality of connectors mounted in the connector holder, a plurality of telecommunications conductors extending between and interconnecting the electronic circuit packs with the connectors in the holder for connection of the circuit packs to further telecommunications conductors extending exteriorly of the module and means for detachably mounting the module in a frame, the connector holder being movable at the connector interface station between a connector housed position, with the connector holder within the housing, and a connector access position with the connector holder extending forwardly of the housing.

2. A shelf module according to claim 1 provided with cooling flow passage means to remove heat from the circuit packs, the cooling flow passage means having an inlet below the receiving stations and an outlet above the receiving stations.

3. A shelf module according to claim 2 wherein the circuit packs are disposed side-by-side horizontally with each circuit pack being planar and extending vertically and with adjacent circuit packs defining vertically extending parts of the cooling flow passage means.

4. A shelf module according to claim 2 wherein the module has a front and a rear and the circuit packs are arranged side-by-side, horizontally in at least two rows, one row above another, the circuit packs each being slidable forwardly from the receiving stations.

5. A shelf module according to claim 4 wherein the connector holder is pivotally connected at a front region of the housing for pivotal movement between the connector housed position and the connector access position with the connector holder pivoted forwardly of the housing, and the telecommunications conductors extend from the fronts of the circuit packs, rearwardly into the housing, outwardly from a side of the housing, and then inwardly into the side of the housing to extend close to the pivotal axis of the connector holder and to the connectors.

6. A shelf module according to claim 5 wherein the connector interface station is disposed above the outlet of the cooling flow passage means.

7. Telecommunications equipment comprising a frame having a plurality of bays for detachably receiving telecommunications equipment shelf modules; at least one of the shelf modules comprising a shelf having a housing with a plurality of receiving stations for electronic circuit packs within the housing, a plurality of electronic circuit packs received within the plurality of receiving stations, a connector holder mounted at a connector interface station at a front region of the module, a plurality of connectors mounted in the connector holder, a plurality of telecommunications conductors extending between and interconnecting the electronic circuit packs with the connectors in the holder for connection of the circuit packs to further telecommunications conductors extending exteriorly of the module, and means for detachably mounting the module in the frame, the connector holder being movable at the connector interface station between a connector housed position, with the connector holder within the housing, and a connector access position with the connector holder forwardly of the housing.

8. Telecommunications equipment according to claim 7 wherein the connector holder is pivotally connected at a front region of the housing for pivotal movement between the connector housed position and the connector access position with the connector holder pivoted forwardly of the housing, and the telecommunications conductors extend from the fronts of the circuit packs, rearwardly into the housing, outwardly from a side of the housing and then inwardly into the side of the housing to extend close to the pivotal axis of the connector holder and to the connectors.

9. Telecommunications equipment according to claim 7 wherein with the at least one module detachably located within its bay within the frame further telecommunications conductors extend along a side of the frame and enter into the side of the housing and are connected to the connectors.

10. Telecommunications equipment comprising a housing, a connector holder for holding connectors for telecommunications conductors, the connector holder pivotally mounted to the housing and pivotally movable between a connector housed position with the connector holder within the housing and a connector access position with the connector holder pivoted forwardly of the housing, the connector holder having spaced apart connector mounting positions in at least one arc around the pivotal axis of the connector holder.

11. Telecommunications equipment according to claim 10 wherein the connector mounting positions are disposed in a plurality of arcs extending around the pivotal axis, one arc inside another and with the mounting positions staggered around the pivotal axis from each arc to an adjacent arc.

12. Telecommunications equipment according to claim 11 wherein the connector holder comprises a base extending radially from the pivotal axis and the mounting positions are provided upon the base with the base formed with apertures at the mounting positions for connection of connectors through the apertures with ends of each connector disposed one on each side of the base.

13. Telecommunications equipment according to claim 12 provided with connectors at the mounting positions, telecommunications conductors extending to the ends of the connectors on one side of the base, and other telecommunications conductors extending from ends of the connectors on the other side of the base, all of the telecommunications conductors extending in a radial direction across the base from a position entering the connector holder close to the pivotal axis of the connector holder.

14. Telecommunications equipment comprising:
a frame having a plurality of bays for detachably receiving telecommunication equipment shelf modules;
at least one of the modules comprising a shelf having a housing with a plurality of receiving stations for electronic circuit packs within the housing, a plurality of electronic circuit packs received within the plurality of receiving stations, a back plane within the housing and connected to rears of at least some of the circuit packs, an upwardly extending cooling flow passage defined behind the back plane and connected at a bottom of the flow passage to an air flow inlet chamber located below the circuit packs and to an air flow exit chamber located above the circuit packs, the packs defining upwardly extending air flow spaces between them with the air flow spaces connected to the air flow inlet and exit chambers, a connector holder mounted to the housing at a connector interface station and movable between a connector housed position, with the connector holder within the housing, and a connector access position with the connector holder forwardly of the housing, a plurality of connectors mounted in the connector holder, and a plurality of telecommunications conductors extending between and interconnecting the electronic circuit packs with the connectors in the holder; and means for detachably mounting the at least one module in its receiving station in the frame.

* * * * *